JUNCTION TRANSISTOR STRUCTURE WITH INTERDIGITATED CONFIGURATION HAVING FEATURES TO MINIMIZE LOCALIZED HEATING
Filed Nov. 29, 1963
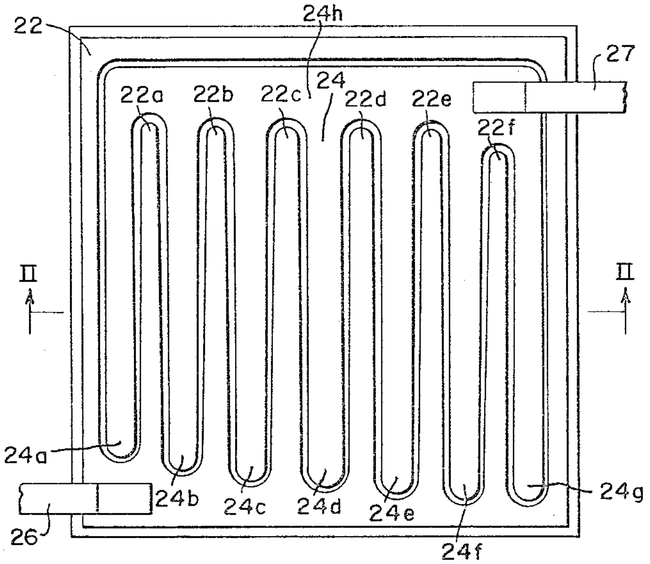
Fig. 1.
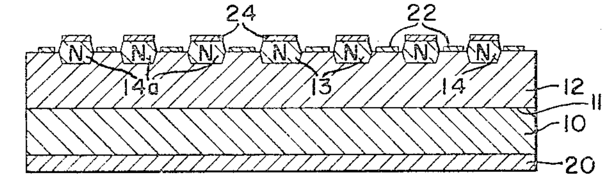
Fig. 2.
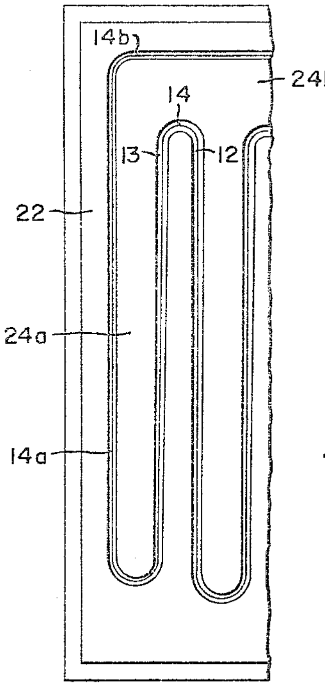
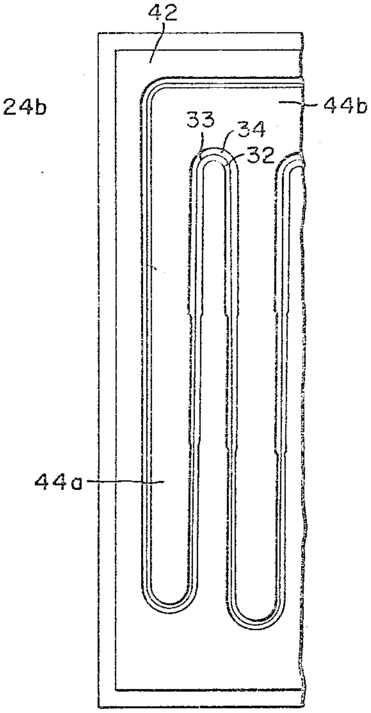
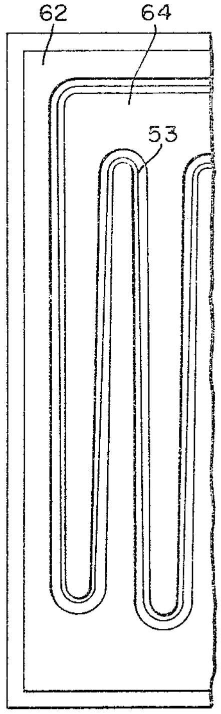
Fig. 3. Fig. 4. Fig. 5.

United States Patent Office 3,309,585
Patented Mar. 14, 1967

3,309,585

JUNCTION TRANSISTOR STRUCTURE WITH INTERDIGITATED CONFIGURATION HAVING FEATURES TO MINIMIZE LOCALIZED HEATING

Richard A. Forrest, Greensburg, Pa., assignor to Westinghouse Electric Corporation, Pittsburgh, Pa., a corporation of Pennsylvania Filed Nov. 29, 1963, Ser. No. 326,989
5 Claims. (Cl. 317—234)

This invention relates generally to semiconductor junction transistors and, more particularly, to junction transistors having an interdigitated emitter-base configuration.

An important consideration in the design of any semiconductor device is to minimize heat development and to facilitate heat dissipation. The failure of a semiconductor device is often due to the accumulation of heat in concentrated areas of the device resulting in thermal breakdown of one of the junctions.

It is now conventional in transistor design to employ an emitter geometry which provides a long emitter junction periphery. Such configurations are generally called interdigitated configurations of which typical examples are those wherein the emitter has a comb-like configuration or a star or snowflake configuration. The base region is disposed substantially surrounding the emitter. This device configuration is generally desirable for providing a good frequency response and increased power handling capacity. In such a configuration localized heating occurs where electron injection is high and heat removal inadequate. This is often the case at the web portion of the emitter where the effective area of the adjacent portion of the base contact is small. By the web portion is meant the emitter portion from which the finger-like projections extend.

It is therefore an object of the present invention to provide an improved junction transistor structure which reduces the likelihood of thermal failure of the device.

Another object of the invention is to provide a base-emitter configuration in a junction transistor so that the benefits of an interdigitated structure are achieved while minimizing localized heating.

Another object is to provide an improved transistor structure which achieves control of heat development without requiring substantial changes in the fabrication of the device.

The invention, briefly, achieves the foregoing and additional objects by providing emitter and base contacts in an interdigitated configuration wherein the extremities of the finger-like projection of the emitter contact are more closely spaced to the base contact than is the remainder (web portion) of the emitter contact. By this configuration, carrier injection is forced away from the likely hot spot areas since the base to emitter resistance is increased in those areas.

The objects of the present invention may also be achieved by utilizing uniformly spaced apart contacts of conventional configuration but modifying the emitter-base junction configuration so that it is more closely disposed to the emitter contact at the extremities of the finger-like projections than at the web portion of the contact.

Another feature of the invention is that the finger-like projections of the contacts are shaped so as to provide greater conductive mass per unit of current in the center portion of the device where heat concentration is otherwise a frequent problem. For example, in the configuration where the emitter is comb-shaped, the central teeth of the comb are made wider than those at the edge of the device.

While the present invention will be particularly described in connection with transistors wherein the emitter is formed by diffusion, it is to be understood that even where the emitter is formed by alloy fusion, its shape and spacing from the base contact may be controlled in accordance with this invention to minimize heat concentration.

The present invention, together with the above-mentioned and additional objects and advantages thereof, may be best understood by reference to the following description taken with the accompanying drawing wherein:

FIGURE 1 is a plan view of a transistor in accordance with the present invention;

FIG. 2 is a cross-sectional view of the device of FIG. 1 taken along the line II—II;

FIG. 3 is an enlarged partial plan view of the device of FIG. 1; and

FIGS. 4 and 5 are enlarged partial plan views of alternative embodiments of the present invention.

Referring to FIGS. 1 to 3, a transistor is shown including an n-type collector region 10, a p-type base region 12 and an n-type emitter region 14. The collector 10 and base 12 are continuous throughout the device. The emitter region 14, however, is disposed in an interdigitated configuration. That is, the emitter includes a plurality of finger-like projections 14*a* which are joined together by a web portion 14*b* extending across the surface of the device near one edge. The base and collector regions 10 and 12 form a p-n junction 11 and the base and emitter regions 12 and 14 form a p-n junction 13.

A collector contact 20 is disposed in ohmic contact with the lower surface of the device. A base contact 22 is disposed in ohmic contact with the base region in a configuration which substantially surrounds the emitter and a further ohmic contact 24 serving as the emitter contact is disposed on substantially all portions of the emitter region 14. The emitter contact 24 has finger-like projections 24*a*, 24*b*, 24*c*, 24*d*, 24*e*, 24*f* and 24*g* and a web portion 24*h* approximating the configuration of the emitter region 14. Leads 26 and 27 are shown in FIG. 1 attached, respectively, to the base and emitter contacts 22 and 24. A lead (not shown) to the collector contact would also be provided.

The general configuration thus far described including collector, base and emitter regions with contacts thereon to provide an interdigitated base-emitter configuration is substantially in accordance with known techniques. It will be apparent to those skilled in the art that the configuration of an interdigitated transistor structure may be varied from that shown.

It will be noted that in FIG. 1 the finger-like portions 24*a* through 24*g* of the emitter contact are not uniformly spaced from the base contact 22 but rather are more closely spaced at the extremities of the finger-like portions than at the common connecting region or web portion 24*h*. This feature is more clearly illustrated in the view of FIG. 3 where, as shown, the base-emitter junction 13 is substantially midway between the base and emitter contacts 22 and 24. Carrier injection at the extremities of the finger-like projections of the emitter is increased compared with that at the remainder of the emitter because of the closer contact spacing which reduces the resistance across the junction. Consequently, the injection of carriers by the emitter into the base region is predominantly toward that portion which more effectively dissipates heat from the structure, namely the larger area portions of the base contact 22 around the periphery of the device. However, the interdigitated construction is preserved so that the capacity to handle large surge currents with a good frequency response is retained.

The structure shown in FIG. 3 is illustrative of the case in which the spacing between the emitter and base contacts is one which is gradually varying as produced by the tapering the the contacts. For this purpose, it has been found satisfactory to employ contacts which provide a spacing of about 7 mils at the largest gap and about 5 mils where the contacts are closely spaced. The differential spacing employed in a particular device will depend on may factors such as required total current handling capacity, case of contact formation and expense. At present it has been found that marked improvement in heat dissipation (determined by current per unit length of emitter junction without thermal damage) may be achieved without substantial increased cost or other disadvantages if the gap between the web portion of the emitter contact and the base contact is up to two times that between the extremities of the emitter contact and the base contact.

The contact configuration shown in FIG. 1 also differs from the conventional by the fact that the finger-like projections of the contacts are of different widths. In the typical device shown the central emitter finger *24d* has an average width of about 25 mils and the adjacent fingers are progressively narrower: *24c* and *24e* are about 23 mils wide; *24b* and *24f* are about 21 mils wide; and *24a* and *24g* are about 19 mils wide. The fingers of the base contact 22 also have different average widths which are greater in the center of the device: *22a* and *22f* are about 15 mils wide; *22b* and *22e* are about 17 mils wide; and *22c* and *22d* are about 19 mils wide. The finger-like projections of the base and emitter regions 12 and 14 have a corresponding variation in width.

Consequently, heat concentration in the center of the device is minimized. The factors determining the width of the fingers are like those determining the gap between the contacts and it has been found that the width of the central contact fingers may be up to one and a half times that of the contact fingers at the edge of the device.

In FIG. 4, an alternative to the embodiment of FIGS. 1 to 3 is illustrated.

The emitter and base contacts 42 and 44 have the same type of interdigitated configuration but instead of being gradually tapered, as in FIG. 3, the contacts are varied in spacing by a step configuration so that the tips of the projections *44a* of the emitter contact are closer to the base contact 42 than the web portion *44b* between the projections *44a*.

In FIG. 5, a further alternative is illustrated wherein the contacts 62 and 64 which are in ohmic contact with the base and emitter regions, respectively, are uniformly spaced. However, the emitter-base junction 53 is shaped so as to provide a closer spacing to the extremities of the finger-like projection of the emitter contact 64 than the remaining portion of the emitter contact so as to provide the same advantages as is provided by the shaping of the contacts as illustrated in FIGS. 3 and 4.

There will now be provided a description of a specific device which was made and successfully operated in accordance with this invention. Reference will be made to FIGS. 1, 2 and 3 in the description of this typical device. The starting wafer was of p-type silicon having a resistivity of about 5 ohm-centimeters and major surface dimensions of about 1 inch on a side and a thickness of about 5.5 mils. This starting wafer was employed to fabricate nine identical devices by simultaneous operations after which the individual devices were separated and encapsulated.

An n-type layer is formed on the starting material by deposition of a suitable impurity such as phosphorous over the entire surface. On the upper surface the n-type layer is selectively removed by masking and etching to form the emitter region in the desired interdigitated configuration. After the selective etch, the material is heated to redistribute the n-type impurities resulting in emitter and collector regions 10 and 14 which are about 2½ mils thick so as to provide a base width of about 0.45 to 0.525 mil. This diffusion and etching procedure results in the mesa like appearance of the emitter 14. Of course, the emitter could also be formed by selective diffusion or by alloying.

Contacts are formed on the base and emitter regions by plating with nickel through a mask and depositing lead or a 95% Pb-5% Sn solder thereon. Leads are then subsequently bonded to the portions of the base and emitter contacts having sufficient area for that purpose and the device is mounted with the collector contact on a header of any of the conventional types with a conventional encapsulation therearound.

While the present invention has been shown and described in a few forms only, it will be apparent that various changes and modifications may be made without departing from the spirit and scope thereof.

What is claimed is:

1. In a junction transistor, a base-emitter configuration wherein said base region has a contact comprising a web portion thereon and finger-like projections extending from said web portion and said emitter region has a contact comprising a web portion thereon and finger-like projections extending from said web portion, the finger-like projections of the contact on said emitter region being each disposed between two finger-like projections of the contact to said base region; the extremities of said finger-like projections of the contact to said emitter being closer to said base contact than the spacing between the web portion of said emitter contact and the extremities of said finger-like projections of the contact to said base region in order to minimize localized heating in said transistor.

2. A junction transistor structure comprising: a collector region of a first semiconductivity type; an ohmic collector contact on said collector region; a base region of a second semiconductivity type disposed in p-n junction forming relationship with said collector region; an ohmic base contact on said base region; an emitter region of said first semiconductivity type disposed in p-n junction forming relationship with said base region; an ohmic emitter contact on said emitter region; said base contact comprising a web portion on said base region and finger-like projections extending from said web portion; said emitter contact comprising a web portion on said emitter region and finger-like projections extending from said web portion; said base contact and said emitter contact being disposed with said base contact at least substantially surrounding said emitter contact; the p-n junction between said base and emitter regions being disposed substantially midway between said base and emitter contacts and the spacing between the web portion of said emitter contact and said base contact being up to two times greater than that between the extremities of said emitter contact and said base contact to minimize heat concentration in said structure during operation.

3. A junction transistor structure in accordance with claim 2 wherein: the finger-like projections of the emitter and base contacts are substantially parallel and the width of said finger-like projections differs so that the greatest width occurs at the center of the device and the least at the periphery.

4. A junction transistor structure in accordance with claim 3 wherein: the finger-like projections of the emitter contact vary in average width by a factor up to one and a half times and the finger-like projections of the base contact also vary in average width by a factor up to one and a half times.

5. A semiconductor junction transistor having emitter, base and collector regions and ohmic contacts on each of said regions; said ohmic contacts on said base and emitter regions being of comb-like shape and in an interdigitated configuration such that each has a plurality of finger-like projections of which each finger-like projection of said emitter contact is disposed between two finger-like projections of said base contact; said finger-like projections of said emitter contact varying in width so that the finger-like projections at the center of the device are of greater width than the width of the remaining finger-like projections by up to one and a half times.

References Cited by the Examiner

UNITED STATES PATENTS

| | | | |
|---|---|---|---|
| 2,816,847 | 12/1957 | Shockley | 317—234 |
| 3,124,640 | 3/1964 | Armstrong | 317—324 |
| 3,214,652 | 10/1965 | Knowles | 317—235 |
| 3,225,261 | 12/1965 | Wolf | 317—235 |

DAVID J. GALVIN, *Primary Examiner.*